United States Patent
Hsu et al.

(10) Patent No.: US 11,848,253 B2
(45) Date of Patent: Dec. 19, 2023

(54) SEMICONDUCTOR STRUCTURE WITH AN AIR GAP

(71) Applicant: UNITED MICROELECTRONICS CORP., Hsin-Chu (TW)

(72) Inventors: Ching-Pin Hsu, Tainan (TW);
Chih-Jung Wang, Tainan (TW);
Chu-Chun Chang, Kaohsiung (TW);
Kuo-Yuh Yang, Hsinchu County (TW);
Chia-Huei Lin, Hsinchu (TW); Purakh Raj Verma, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 17/521,805

(22) Filed: Nov. 8, 2021

(65) Prior Publication Data

US 2022/0068766 A1    Mar. 3, 2022

Related U.S. Application Data

(62) Division of application No. 16/835,349, filed on Mar. 31, 2020, now Pat. No. 11,205,609.

(30) Foreign Application Priority Data

Feb. 3, 2020 (CN) .......................... 202010078703.1

(51) Int. Cl.
*H01L 23/482* (2006.01)
*H01L 21/02* (2006.01)
(Continued)

(52) U.S. Cl.
CPC .... *H01L 23/4821* (2013.01); *H01L 21/02164* (2013.01); *H01L 21/02167* (2013.01);
(Continued)

(58) Field of Classification Search
CPC ........... H01L 23/4821; H01L 21/02164; H01L 21/02167; H01L 21/02211; H01L 21/76243; H01L 21/7682; H01L 21/485
See application file for complete search history.

(56) References Cited

U.S. PATENT DOCUMENTS 10,211,146 B2    2/2019   He
10,515,876 B1   12/2019   Zhou
(Continued)

FOREIGN PATENT DOCUMENTS

CN    103151296 A    6/2013
CN    207320123 U    5/2018
(Continued)

*Primary Examiner* — Monica D Harrison
*Assistant Examiner* — Andre C Stevenson
(74) *Attorney, Agent, or Firm* — Winston Hsu (57) ABSTRACT

A semiconductor structure with an air gap includes a dielectric stack having a first dielectric layer on a substrate, a second dielectric layer on the first dielectric layer, and a third dielectric layer on the second dielectric layer. A first conductive layer and a second conductive layer are disposed in the dielectric stack. The first conductive layer and the second conductive layer are coplanar. A cross-like-shaped air gap is disposed in the dielectric stack between the first and second conductive layers. An oxide layer is disposed on a sidewall of the second dielectric layer within the cross-like-shaped air gap.

10 Claims, 5 Drawing Sheets

(51) Int. Cl.
  *H01L 21/762* (2006.01)
  *H01L 21/768* (2006.01)
  *H01L 23/485* (2006.01)

(52) U.S. Cl.
  CPC .... *H01L 21/02211* (2013.01); *H01L 21/7682* (2013.01); *H01L 21/76243* (2013.01); *H01L 23/485* (2013.01)

(56) References Cited

U.S. PATENT DOCUMENTS

| | | | |
|---|---|---|---|
| 10,707,120 B1* | 7/2020 | Yami | H01L 21/76224 |
| 2011/0021036 A1 | 1/2011 | Braecklmann | |
| 2012/0037962 A1 | 2/2012 | Breyta | |
| 2017/0330790 A1 | 11/2017 | He | |
| 2017/0330832 A1* | 11/2017 | He | H01L 27/1203 |
| 2017/0345706 A1* | 11/2017 | Tsai | H01L 21/76805 |
| 2019/0067090 A1* | 2/2019 | Chen | H01L 23/5222 |
| 2020/0185495 A1* | 6/2020 | Tseng | H01L 29/0649 |

FOREIGN PATENT DOCUMENTS

| | | |
|---|---|---|
| KR | 10-2013-0118559 A | 10/2013 |
| WO | 2009/127914 A1 | 10/2009 |

* cited by examiner

SEMICONDUCTOR STRUCTURE WITH AN AIR GAP

CROSS REFERENCE TO RELATED APPLICATIONS

This is a division of U.S. application Ser. No. 16/835,349 filed Mar. 31, 2020, which is included in its entirety herein by reference.

BACKGROUND OF THE INVENTION

1. Field of the Invention

The present invention relates to the field of semiconductor technology, and in particular, to a semiconductor structure having an air gap and a manufacturing method thereof.

2. Description of the Prior Art

Radio-frequency switches (RF switches) configured to turn on and off a radio frequency (RF) are used for front ends of portable communication terminals such as mobile phones. In such radio-frequency switches, a low loss of a radio frequency passing therethrough is an important characteristic. For such a low loss, it is important to reduce a resistance (on-resistance) of an FET in an on state or a capacitance (off-capacitance, Coff) of the FET in an off state, i.e., to reduce the product (Ron*Coff) of the on-resistance and the off-capacitance.

To reduce Coff, a conventional technique is to form an air gap in the dielectric layer above the gate to reduce the parasitic capacitance between the gate and adjacent contact plugs and wires. However, the improvement effect is still limited. Therefore, there is still a need in the art for an improved semiconductor structure to further reduce Coff of the RF switches.

SUMMARY OF THE INVENTION

It is one purpose of the present invention to provide an improved semiconductor structure with an air gap and a manufacturing method thereof, so as to overcome the deficiencies and disadvantages in the prior art.

One aspect of the invention provides a semiconductor structure with an air gap including a substrate; a dielectric stack comprising a first dielectric layer disposed on the substrate, a second dielectric layer disposed on the first dielectric layer, and a third dielectric layer disposed on the second dielectric layer; a first conductive layer disposed in the dielectric stack; a second conductive layer disposed in the dielectric stack and spaced apart from the first conductive layer, wherein the first conductive layer and the second conductive layer are coplanar; and a cross-like-shaped air gap disposed in the dielectric stack between the first conductive layer and the second conductive layer. The air gap has a widened middle portion in the second dielectric layer, a tapered upper portion in the third dielectric layer, and a tapered lower portion in the first dielectric layer. The widened middle portion has a first width, the tapered upper portion has a second width and the tapered lower portion has a third width. The first width is greater than the second width and the third width. The third width is smaller than or equal to the second width.

According to some embodiments, the third dielectric layer comprises an extension portion that extends into the cross-like-shaped air gap and conformally covers a sidewall of the first dielectric layer adjacent to the tapered lower portion of the cross-like-shaped air gap and a sidewall of the second dielectric layer adjacent to the widened middle portion of the cross-like-shaped air gap.

According to some embodiments, the extension portion of the third dielectric layer is in direct contact with the first dielectric layer.

According to some embodiments, the first conductive layer and the second conductive layer are not exposed in the cross-like-shaped air gap.

According to some embodiments, the first conductive layer and the second conductive layer comprise a copper damascened layer.

According to some embodiments, the substrate comprises a silicon-on-insulator (SOI) substrate.

According to some embodiments, the semiconductor structure with an air gap further includes: a transistor disposed on the substrate, wherein the transistor comprises a gate, and wherein the cross-like-shaped air gap is disposed over or above the gate.

According to some embodiments, the first dielectric layer has a composition that is different from that of the second dielectric layer and the third dielectric layer.

According to some embodiments, the first dielectric layer comprises a TEOS oxide layer, and wherein the second dielectric layer and the third dielectric layer comprise a low dielectric constant (low-k) or ultra-low k material layer.

According to some embodiments, the semiconductor structure with an air gap further includes: a first capping layer between the first dielectric layer and the second dielectric layer; a second capping layer between the second dielectric layer and the third dielectric layer; and an etch stop layer between the third dielectric layer and the second capping layer.

According to some embodiments, the first capping layer and the second capping layer comprise a silicon carbide layer, and wherein the etch stop layer comprises a silicon nitride layer.

Another aspect of the invention provides a semiconductor structure with an air gap, including: a substrate; a dielectric stack comprising a first dielectric layer disposed on the substrate, a second dielectric layer disposed on the first dielectric layer, and a third dielectric layer disposed on the second dielectric layer; a first conductive layer disposed in the dielectric stack; a second conductive layer disposed in the dielectric stack and spaced apart from the first conductive layer, wherein the first conductive layer and the second conductive layer are coplanar; a cross-like-shaped air gap disposed in the dielectric stack between the first conductive layer and the second conductive layer; and an oxide layer disposed on a sidewall of the second dielectric layer within the cross-like-shaped air gap.

According to some embodiments, the oxide layer is a silicon oxide layer.

According to some embodiments, the oxide layer has a thickness of about 10-50 angstroms.

According to some embodiments, the cross-like-shaped air gap has a widened middle portion in the second dielectric layer, a tapered upper portion in the third dielectric layer, and a tapered lower portion in the first dielectric layer.

According to some embodiments, the third dielectric layer comprises an extension portion that extends into the cross-like-shaped air gap and conformally covers a sidewall of the first dielectric layer adjacent to the tapered lower portion of the cross-like-shaped air gap and a sidewall of the second dielectric layer adjacent to the widened middle portion of the cross-like-shaped air gap.

According to some embodiments, the extension portion of the third dielectric layer is in direct contact with the first dielectric layer and the oxide layer.

According to some embodiments, the first conductive layer and the second conductive layer are not exposed within the cross-like-shaped air gap.

According to some embodiments, the first conductive layer and the second conductive layer comprise a copper damascened layer.

According to some embodiments, the semiconductor structure with an air gap further includes: a transistor disposed on the substrate, wherein the transistor comprises a gate, and wherein the cross-like-shaped air gap is disposed over or above the gate.

According to some embodiments, the first dielectric layer has a composition that is different from that of the second dielectric layer and the third dielectric layer.

According to some embodiments, the first dielectric layer comprises a TEOS oxide layer, and wherein the second dielectric layer and the third dielectric layer comprise a low dielectric constant (low-k) or ultra-low k material layer.

According to some embodiments, the semiconductor structure with an air gap further includes: a first capping layer between the first dielectric layer and the second dielectric layer; a second capping layer between the second dielectric layer and the third dielectric layer; and an etch stop layer between the third dielectric layer and the second capping layer.

According to some embodiments, the first capping layer and the second capping layer comprise a silicon carbide layer, and wherein the etch stop layer comprises a silicon nitride layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
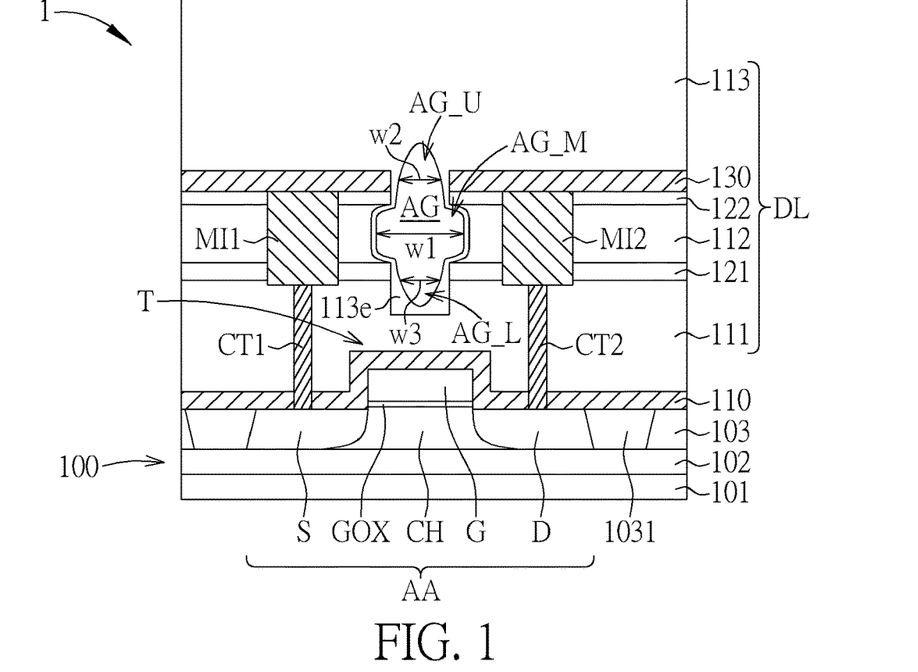
FIG. 1 is a schematic cross-sectional view of a semiconductor structure having an air gap according to an embodiment of the present invention.

FIG. 1 is a schematic cross-sectional view of a semiconductor structure having an air gap according to an embodiment of the present invention. As shown in FIG. 1, the semiconductor structure 1 with an air gap according to the present invention includes: a substrate 100; a dielectric stack DL including a first dielectric layer 111 disposed on the substrate 100 and a second dielectric layer 112 disposed on the first dielectric layer 111 and a third dielectric layer 113 disposed on the second dielectric layer 112. According to the embodiment of the present invention, the semiconductor structure 1 with an air gap further includes: a first capping layer 121 located between the first dielectric layer 111 and the second dielectric layer 112; a second capping layer 122 located between the second dielectric layer 112 and the third dielectric layer 113; a first etch stop layer 110 between the first dielectric layer 111 and the substrate 100, and a second etch stop layer 130 between the third dielectric layer 113 and the second capping layer 122.

According to an embodiment of the present invention, the substrate 100 may include a silicon-on-insulator (SOI) substrate 100 including a silicon substrate 101, a buried oxide layer 102, and a device layer 103. The buried oxide layer 102 is located between the silicon substrate 101 and the device layer 103 to isolate the silicon substrate 101 from the device layer 103. According to an embodiment of the present invention, the device layer 103 may comprise single crystalline silicon, for example, P-type doped single crystalline silicon, but is not limited thereto.

According to the embodiment of the present invention, the first dielectric layer 111 has a composition different from that of the second dielectric layer 112 and the third dielectric layer 113. According to the embodiment of the present invention, the first dielectric layer 111 may include a tetra-ethoxysilane (TEOS) silicon oxide layer, and the second dielectric layer 112 and the third dielectric layer 113 may include a low dielectric constant (low-k) or an ultra-low dielectric constant (ultra-low k) material layer. According to an embodiment of the present invention, the first capping layer 121 and the second capping layer 122 may include a silicon carbide layer, and the first etch stop layer 110 and the second etch stop layer 130 may include a silicon nitride layer.

According to an embodiment of the present invention, a shallow trench isolation (STI) structure 1031 is provided in the device layer 103, which defines at least one active area AA, and at least one field effect transistor (FET) T is formed on the active area AA. According to an embodiment of the present invention, the field effect transistor T may include a source doped region S, a drain doped region D, a channel region CH between the source doped region S and the drain doped region D, a gate G located above the channel region CH, and a gate oxide layer GOX interposed between the gate G and the channel region CH. For example, the source doped region S and the drain doped region D may be $N^+$ doped regions.

According to an embodiment of the present invention, the semiconductor structure 1 with an air gap further includes: a first conductive layer MI1 provided in the dielectric stack DL; a second conductive layer MI2 provided in the dielectric stack DL and spaced apart from the first conductive layer MI1 wherein the first conductive layer MI1 and the second conductive layer MI2 are coplanar. The first conductive layer MI1 and the second conductive layer MI2 are electrically connected to the source doped region S and the drain doped region D via the first contact plug CT1 and the second contact plug CT2, respectively. According to the embodiment of the present invention, the first contact plug CT1 and the second contact plug CT2 may include tungsten, copper, titanium, titanium nitride, or the like. According to an embodiment of the present invention, the first conductive layer MI1 and the second conductive layer MI2 may include a copper damascened layer.

According to the embodiment of the present invention, the semiconductor structure 1 with an air gap further includes: a cross-like-shaped air gap AG disposed in the dielectric stack DL and located between the first conductive layer MI1 and the second conductive layer MI2, wherein the cross-like-shaped air gap AG includes a widened middle portion AG_M located in the second dielectric layer 112, a tapered upper portion AG_U located in the third dielectric layer 113, and a tapered lower portion AG_L located in the first dielectric layer 111.

According to the embodiment of the present invention, the widened middle portion AG_M has a first width W1, the tapered upper portion AG_U has a second width W2, and the tapered lower portion AG_L has a third width W3, wherein the first width W1 is larger than the second width W2 and the third width W3, and the third width W3 is smaller than or equal to the second width W2.

According to an embodiment of the present invention, the third dielectric layer 113 includes an extension portion 113e extending into the cross-like-shaped air gap AG and conformally covering the sidewall of the first dielectric adjacent layer 111 adjacent to the tapered lower portion AG_L of the cross-like-shaped air gap AG and the sidewall of the second dielectric layer 112 adjacent to the widened middle portion AG_M of the cross-like-shaped air gap AG. According to an embodiment of the present invention, the extension portion 113e of the third dielectric layer 113 is in direct contact with the first dielectric layer 111. According to the embodiment of the present invention, the first conductive layer MI1 and the second conductive layer MI2 are not exposed in the cross-like-shaped air gap AG.

Figure 2:
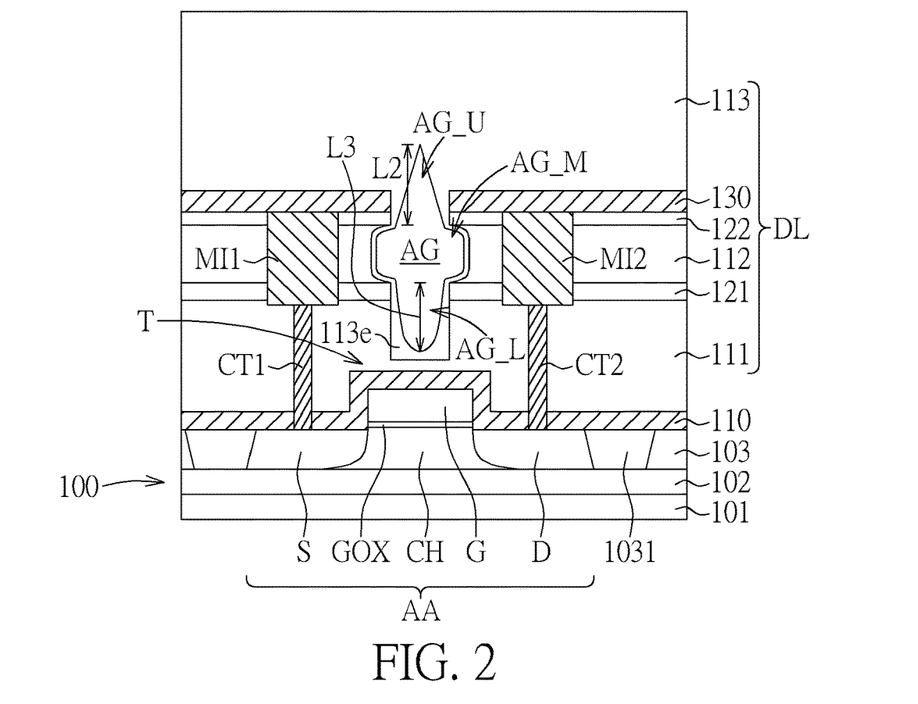
FIG. 2 illustrates a cross-sectional profile of a cross-like-shaped air gap according to another embodiment.

FIG. 2 illustrates a cross-sectional profile of a cross-like-shaped air gap according to another embodiment. As shown in FIG. 2, the cross-like-shaped air gap AG also includes a widened middle portion AG_M located in the second dielectric layer 112, a tapered upper portion AG_U located in the third dielectric layer 113, and a tapered lower portion AG_L located in the first dielectric layer 111. The cross-like-shaped air gap AG of FIG. 2 is different from the cross-like-shaped air gap AG of FIG. 1 in that the tapered upper portion AG_U of the cross-like-shaped air gap AG of FIG. 2 is relatively sharp, and the tapered lower AG_L is relatively blunt or flat. In addition, the length L2 of the tapered upper portion AG_U in the vertical direction is less than or equal to the length L3 of the tapered lower portion AG_L in the vertical direction.

Figure 3:
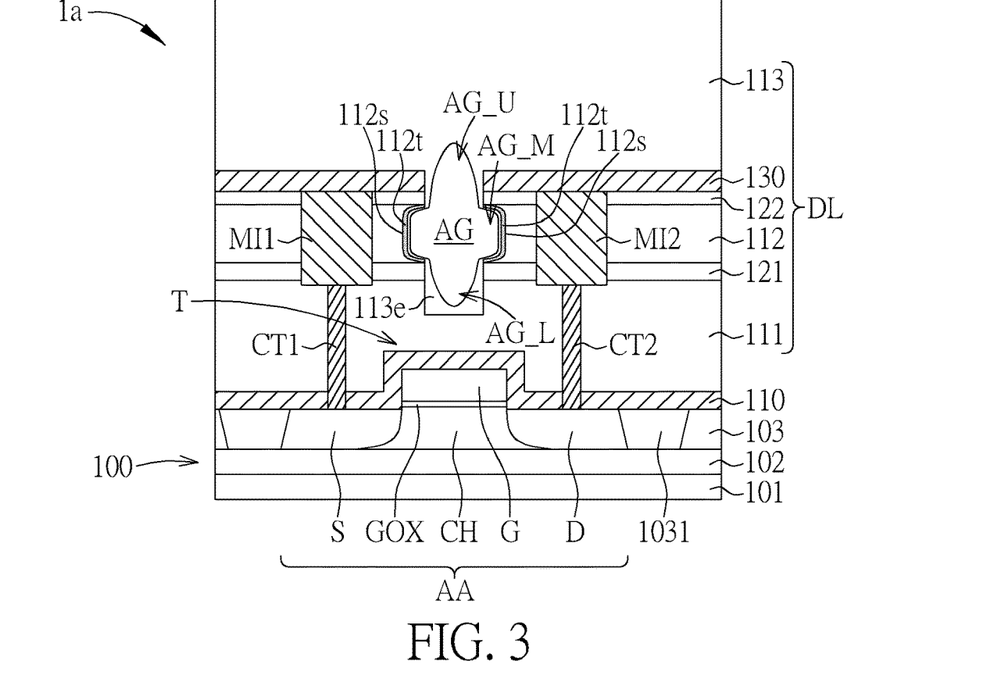
FIG. 3 is a schematic cross-sectional view of a semiconductor structure having an air gap according to another embodiment of the present invention.

FIG. 3 is a schematic cross-sectional view of a semiconductor structure having an air gap according to another embodiment of the present invention. The same elements, regions, or layers are still represented by the same symbols or numeral numbers. As shown in FIG. 3, another aspect of the present invention provides a semiconductor structure 1a having an air gap, including: a substrate 100; a dielectric stack DL including a first dielectric layer 111 disposed on the substrate 100, a second dielectric layer 112 disposed on the first dielectric layer 111 and a third dielectric layer 113 disposed on the second dielectric layer 112. The semiconductor structure 1a with an air gap further includes: a first conductive layer MI1 provided in the dielectric stack DL; a second conductive layer MI2 provided in the dielectric stack DL and spaced apart from the first conductive layer MI1. The first conductive layer MI1 and the second conductive layer MI2 are coplanar.

According to the embodiment of the present invention, the semiconductor structure 1a having an air gap further includes: a cross-like-shaped air gap AG disposed in the dielectric stack DL and located between the first conductive layer MI1 and the second conductive layer MI2. According to the embodiment of the present invention, the semiconductor structure 1a having an air gap further includes: an oxide layer 112t disposed on the sidewall 112s of the second dielectric layer 112 in the cross-like-shaped air gap AG. According to an embodiment of the present invention, the oxide layer 112 is a silicon oxide layer. According to an embodiment of the present invention, the thickness of the oxide layer 112t is between 10 and 50 angstroms.

According to the embodiment of the present invention, the cross-like-shaped air gap AG also includes a widened middle portion AG_M located in the second dielectric layer 112, a tapered upper portion AG_U located in the third dielectric layer 113, and a tapered lower portion AG_L located In the first dielectric layer 111. According to an embodiment of the present invention, the third dielectric layer 113 includes an extension portion 113e extending into the cross-like-shaped air gap AG and conformally covering the sidewall of the first dielectric adjacent layer 111 adjacent to the tapered lower portion AG_L of the cross-like-shaped air gap AG and the sidewall 112s of the second dielectric layer 112 adjacent to the widened middle portion AG_M of the cross-like-shaped air gap AG. According to an embodiment of the present invention, the extension portion 113e of the third dielectric layer 113 is in direct contact with the first dielectric layer 111. According to an embodiment of the present invention, the extension portion 113e of the third dielectric layer 113 is in direct contact with the first dielectric layer 111 and the oxide layer 112t.

According to the embodiment of the present invention, the first conductive layer MI1 and the second conductive layer MI2 are not exposed in the cross-like-shaped air gap AG. According to an embodiment of the present invention, the first conductive layer MI1 and the second conductive layer MI2 include a copper damascened layer.

According to the embodiment of the present invention, the substrate 100 may include an SOI substrate, but is not limited thereto. According to the embodiment of the present invention, the semiconductor structure 1a with an air gap further includes: a transistor T disposed on the substrate 100, wherein the transistor T includes a gate G, and the cross-like-shaped air gap AG is disposed over or above the gate G.

Although the cross-like-shaped air gap AG shown in the figures is positioned directly over the gate G, it is to be understood that in some embodiments the cross-like-shaped air gap AG may be positioned above the gate G with an offset with respect to the underlying gate G.

According to the embodiment of the present invention, the first dielectric layer 111 has a composition different from that of the second dielectric layer 112 and the third dielectric layer 113. According to the embodiment of the present invention, the first dielectric layer 111 includes a TEOS silicon oxide layer, wherein the second dielectric layer 112 and the third dielectric layer 113 include a low dielectric constant or ultra-low dielectric constant material layer.

According to the embodiment of the present invention, the semiconductor structure 1a with an air gap further includes: a first capping layer 121 located between the first dielectric layer 111 and the second dielectric layer 112; a second capping layer 122 located between the second dielectric layer 112 and the third dielectric layer 113; a first etch stop layer 110 located between the first dielectric layer 111 and the substrate 100; and a second etch stop layer 130 located between the third dielectric layer 113 and the second capping layer 122. According to an embodiment of the present invention, the first capping layer 121 and the second capping layer 122 include a silicon carbide layer, and the first etch stop layer 110 and the second etch stop layer 130 include a silicon nitride layer.

Those skilled in the art should understand that the structures depicted throughs FIG. 1 to FIG. 3 are for illustration purposes only. In other embodiments, the air gap AG may also extend to the upper dielectric layer or be located between the upper metal layers to achieve the purposes of further reducing the parasitic capacitance between wires.

Figure 4:
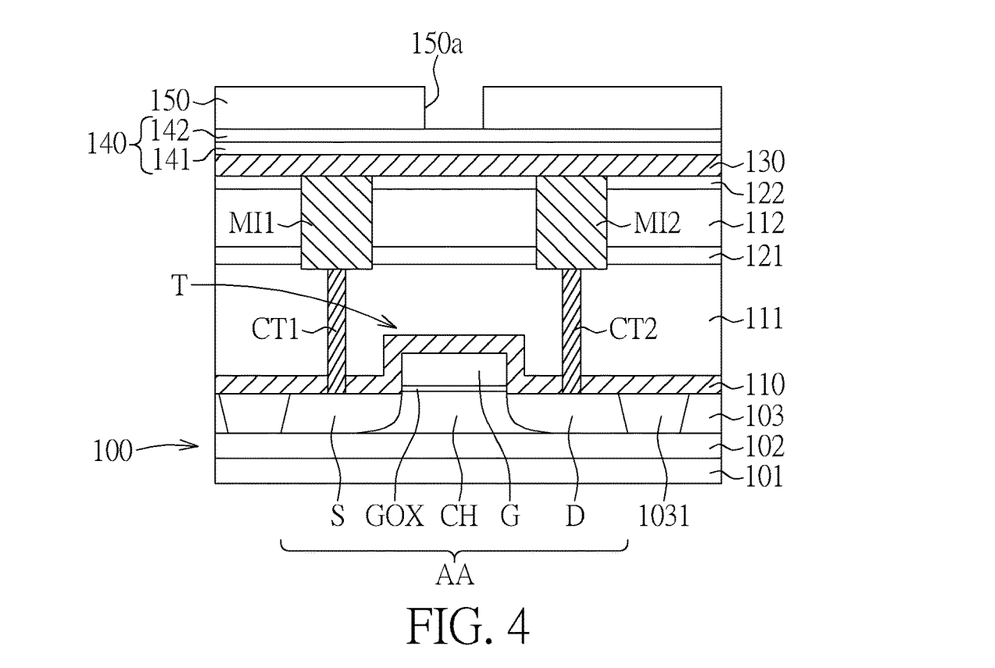
FIGS. 4 to 8 are schematic cross-sectional views showing a method for fabricating a semiconductor structure with an air gap according to an embodiment of the present invention.

Please refer to FIGS. 4 to 8, which are schematic cross-sectional views showing a method for fabricating a semiconductor structure with an air gap according to an embodiment of the present invention. The same elements, regions or layers are still represented by the same symbols or numeral numbers. As shown in FIG. 4, a substrate 100 such as a semiconductor substrate is first provided. According to an embodiment of the present invention, the substrate 100 may be an SOI substrate including a silicon substrate 101, a buried oxide layer 102, and a device layer 103. The buried oxide layer 102 is located between the silicon substrate 101 and the device layer 103 to isolate the silicon substrate 101 from the device layer 103. According to an embodiment of the present invention, the device layer 103 may be single crystalline silicon, for example, P-type doped single crystalline silicon, but is not limited thereto.

According to an embodiment of the present invention, a shallow trench isolation structure 1031 is provided in the device layer 103, which defines at least one active area AA, and at least one field effect transistor T is formed on the active area AA. According to an embodiment of the present invention, the field effect transistor T may include a source doped region S, a drain doped region D, a channel region CH between the source doped region S and the drain doped region D, a gate G located above the channel region CH, and a gate oxide layer GOX interposed between the gate G and the channel region CH. For example, the source doped region S and the drain doped region D may be N$^+$ doped regions.

According to an embodiment of the present invention, a chemical vapor deposition (CVD) process may be carried out to sequentially form a first etch stop layer 110, a first dielectric layer 111, a first capping layer 121, a second dielectric layer 112, and a second capping layer 122 on the substrate 100. According to an embodiment of the present invention, a first contact plug CT1 and a second contact plug CT2 may be formed in the first etch stop layer 110 and the first dielectric layer 111. A first conductive layer MI1 and a second conductive layer MI2 are formed in the first capping layer 121, the second dielectric layer 112 and the second capping layer 122 above the first contact plug CT1 and a second contact plug CT2, respectively.

According to an embodiment of the invention, the first conductive layer MI1 and the second conductive layer MI2 are coplanar. According to an embodiment of the invention, the first conductive layer MI1 is spaced apart from the second conductive layer MI2. According to an embodiment of the present invention, the first conductive layer MI1 and the second conductive layer MI2 include a copper damascened layer. According to an embodiment of the present invention, the first dielectric layer 111 may include a TEOS silicon oxide layer, and the second dielectric layer 112 may include a low dielectric constant or ultra-low dielectric constant material layer. According to an embodiment of the present invention, the first capping layer 121 and the second capping layer 122 may include a silicon carbide layer, and the first etch stop layer 110 may include a silicon nitride layer.

Subsequently, a second etch stop layer 130 may be formed on the second capping layer 122, the first conductive layer MI1, and the second conductive layer MI2. Then, a pattern transfer layer 140, for example, a hard mask layer 141 and an anti-reflection layer 142, may be formed on the second etch stop layer 130. According to an embodiment of the present invention, the second etch stop layer 130 may include a silicon nitride layer. According to the embodiment of the present invention, the hard mask layer 141 may include a titanium nitride layer, but is not limited thereto. According to the embodiment of the present invention, the anti-reflection layer 142 may include a silicon oxynitride layer and/or a silicon oxide layer, but is not limited thereto. A patterned photoresist layer 150 is then formed on the anti-reflection layer 142, which includes an opening 150a to expose a part of the anti-reflection layer 142. According to an embodiment of the present invention, the opening 150a is located on the first conductive layer MI1 and the second conductive layer MI2, and is located over or above the gate G.

Figure 5:
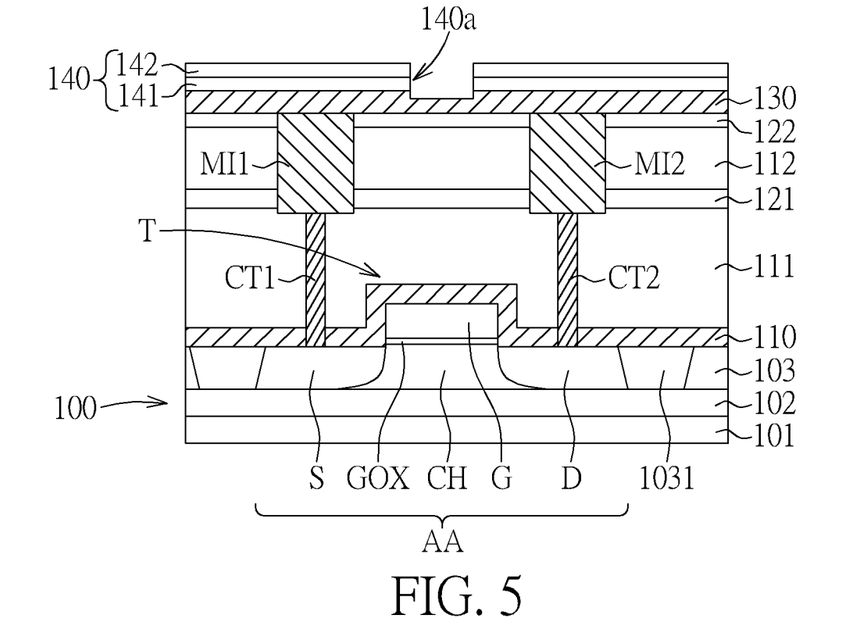

As shown in FIG. 5, an etching process, for example, an anisotropic dry etching process, is performed. The anti-reflection layer 142 and the hard mask layer 141 are etched downward through the opening 150a of the patterned photoresist layer 150 to form an opening 140a. Then, the patterned photoresist layer 150 is removed, so that the pattern of the patterned photoresist layer 150 can be transferred to the pattern transfer layer 140.

Figure 6:
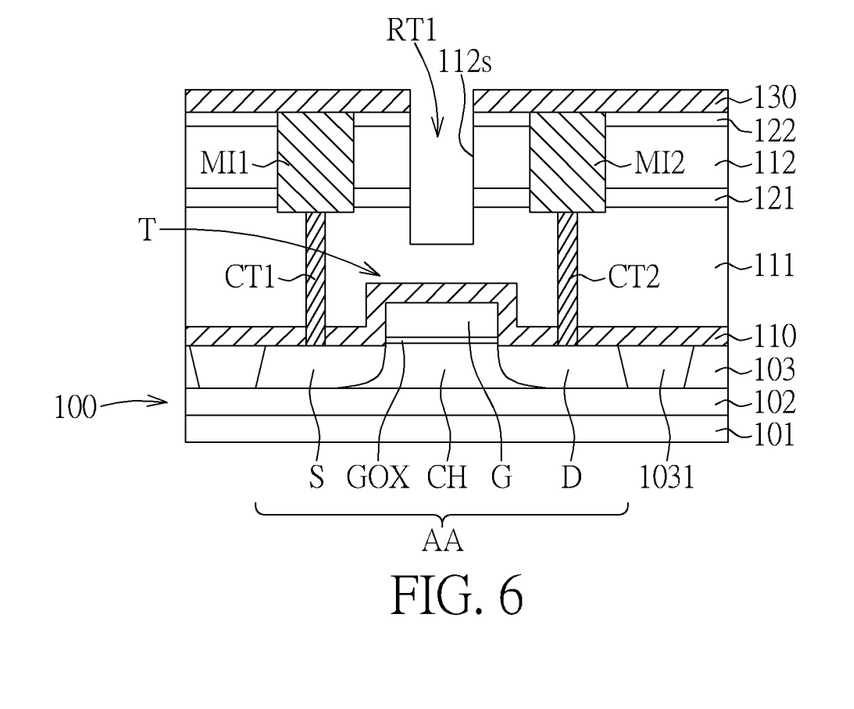

As shown in FIG. 6, next, the pattern transfer layer 140 is used as an etching resist mask, and another etching process is performed, for example, an anisotropic dry etching process. The second etch stop layer 130, the second capping layer 122, the second dielectric layer 112, the first capping layer 121 and the first dielectric layer 111 are etched downward through the opening 140a of the pattern transfer layer 140, thereby forming a first trench RT1. According to an embodiment of the present invention, the above-mentioned etching process is stopped in the first dielectric layer 111, so the bottom of the first trench RT1 is the first dielectric layer 111, and the first etch stop layer 110 is not exposed. In the first trench RT1, the sidewall 112s of the second dielectric layer 112 is exposed.

Figure 9:
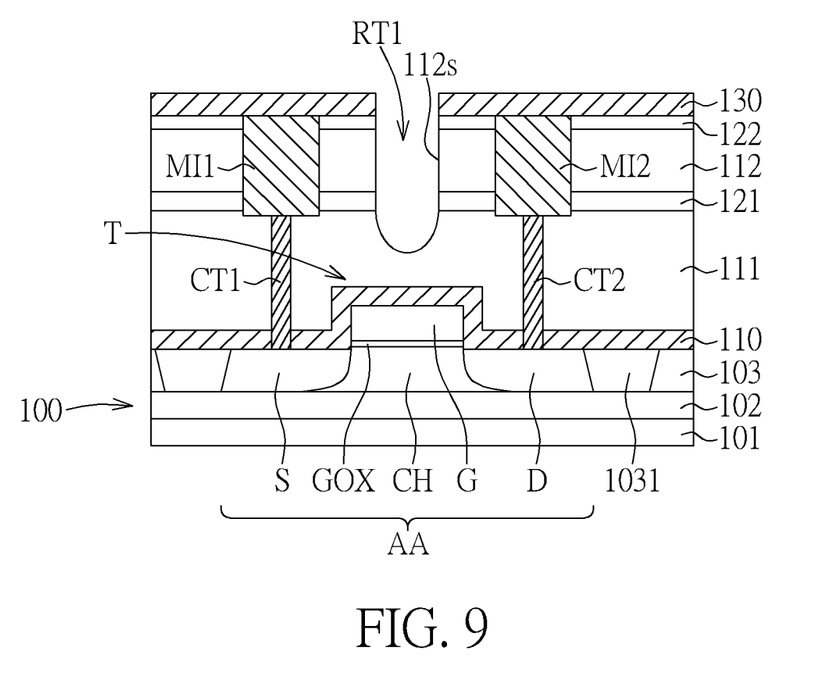
FIG. 9 is a cross sectional view showing the exemplary cured bottom of the first trench.

Subsequently, the pattern transfer layer 140 is removed, and the second etch stop layer 130 is exposed. Although the bottom of the first trench RT1 in FIG. 3 is a flat surface, in other embodiments, the bottom of the first trench RT1 may be a curved surface, as shown in FIG. 9, such a bottom having a curved contour can be achieved by controlling the etching parameters.

Figure 7:
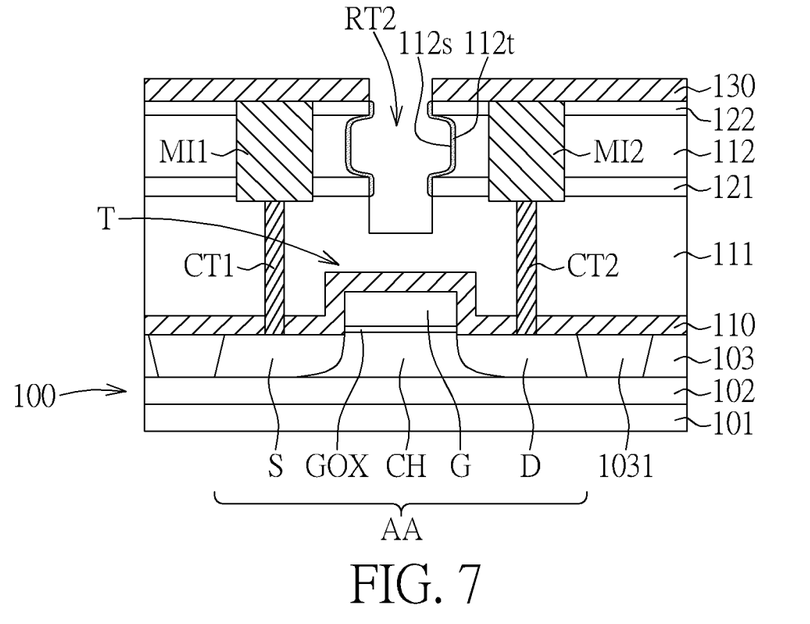

Next, as shown in FIG. 7, an oxygen plasma treatment process and a dilute hydrofluoric acid (DHF) solution wet etching process are performed. The second dielectric layer 112 composed of a low dielectric constant material contacts the oxygen plasma may be etched laterally to form a middle-widened second trench RT2. The sidewall 112s of the second dielectric layer 112 is recessed inward (toward the first conductive layer MI1 and the second conductive layer MI2, respectively).

At the same time, the above-mentioned oxygen plasma treatment process will form an oxide layer 112t on the sidewall 112s of the second dielectric layer 112. According to an embodiment of the present invention, for example, the oxide layer 112t is a silicon oxide layer, and its thickness is between 10 and 50 angstroms, for example, between 20 and 30 angstroms. This oxide layer 112t can prevent water or moisture from diffusing into the second dielectric layer 112 and making contact with the first conductive layer MI1 and the second conductive layer MI2.

Figure 8:
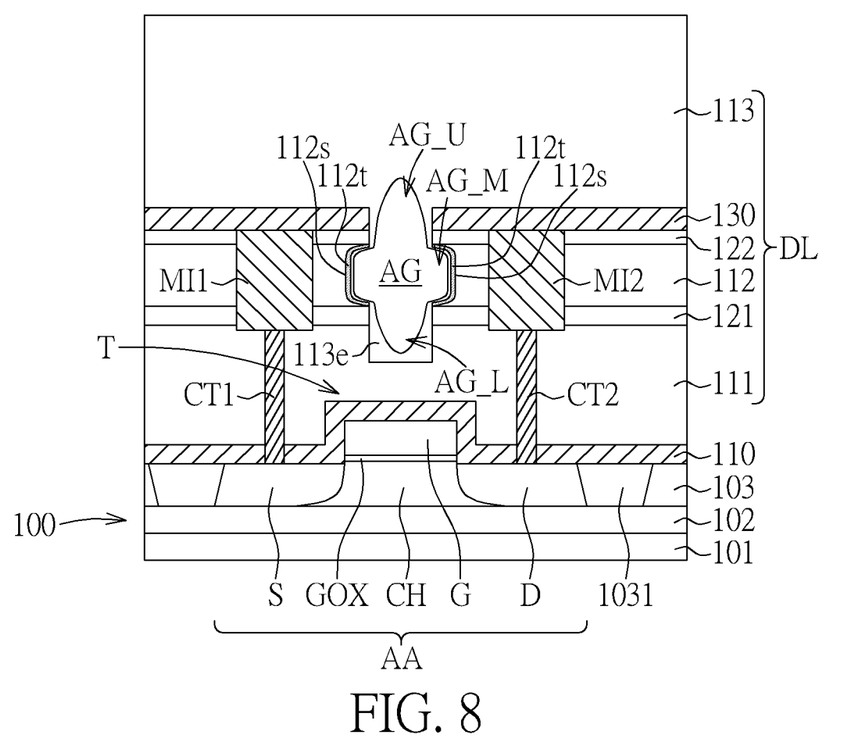

As shown in FIG. 8, finally, a chemical vapor deposition (CVD) process or other methods may be performed. A third dielectric layer 113 is deposited on the second etch stop layer 130 and an interior surface of the second trench RT2. The upper opening of the second trench RT2 is sealed to form a cross-like-shaped air gap AG. According to the embodiment of the present invention, the cross-like-shaped air gap AG includes a widened middle portion AG_M located in the second dielectric layer 112, a tapered upper portion AG_U located in the third dielectric layer 113, and a tapered lower portion AG_L located in the first dielectric layer 111.

For example, the third dielectric layer 113 may include a low dielectric constant or ultra-low dielectric constant material layer. According to an embodiment of the present invention, the third dielectric layer 113 includes an extension portion 113e extending into the cross-like-shaped air gap AG and conformally covering an interior surface adjacent to the cross-like-shaped air gap AG. According to an embodiment of the present invention, the extension portion 113e of the third dielectric layer 113 is in direct contact with the first dielectric layer 111 and the oxide layer 112t.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with an air gap, comprising:
    a substrate;
    a dielectric stack comprising a first dielectric layer disposed on the substrate, a second dielectric layer disposed on the first dielectric layer, and a third dielectric layer disposed on the second dielectric layer;
    a first conductive layer disposed in the dielectric stack;
    a second conductive layer disposed in the dielectric stack and spaced apart from the first conductive layer, wherein the first conductive layer and the second conductive layer are coplanar; and
    a cross-like-shaped air gap disposed in the dielectric stack between the first conductive layer and the second conductive layer, wherein the air gap has a tapered upper portion in the third dielectric layer, a tapered lower portion in the first dielectric layer, and a widened middle portion laterally extending into the second dielectric layer toward the first conductive layer and the second conductive layer thereby forming a greatest width of the cross-like-shaped air gap between a top surface of the third dielectric layer and a bottom surface of the first dielectric layer, wherein the third dielectric layer comprises an extension portion that extends into the cross-like-shaped air gap and conformally covers a sidewall of the first dielectric layer adjacent to the tapered lower portion of the cross-like-shaped air gap and a sidewall of the second dielectric layer adjacent to the widened middle portion of the cross-like-shaped air gap, wherein the extension portion of the third dielectric layer is in direct contact with the sidewalls of the second dielectric layer and the first dielectric layer.

2. The semiconductor structure with an air gap according to claim 1, wherein the first conductive layer and the second conductive layer are not exposed in the cross-like-shaped air gap.

3. The semiconductor structure with an air gap according to claim 1, wherein the first conductive layer and the second conductive layer comprise a copper damascened layer.

4. The semiconductor structure with an air gap according to claim 1, wherein the substrate comprises a silicon-on-insulator (SOI) substrate.

5. The semiconductor structure with an air gap according to claim 1 further comprising:
    a transistor disposed on the substrate, wherein the transistor comprises a gate, and wherein the cross-like-shaped air gap is disposed over or above the gate.

6. The semiconductor structure with an air gap according to claim 1, wherein the first dielectric layer has a composition that is different from that of the second dielectric layer and the third dielectric layer.

7. The semiconductor structure with an air gap according to claim 1, wherein the first dielectric layer comprises a TEOS oxide layer, and wherein the second dielectric layer and the third dielectric layer comprise a low dielectric constant or ultra-low k material layer.

8. The semiconductor structure with an air gap according to claim 1 further comprising:
    a first capping layer between the first dielectric layer and the second dielectric layer;
    a second capping layer between the second dielectric layer and the third dielectric layer; and
    an etch stop layer between the third dielectric layer and the second capping layer.

9. The semiconductor structure with an air gap according to claim 8, wherein the first capping layer and the second capping layer comprise a silicon carbide layer, and wherein the etch stop layer comprises a silicon nitride layer.

10. A semiconductor structure with an air gap, comprising:
    a substrate;
    a dielectric stack comprising a first dielectric layer disposed on the substrate, a second dielectric layer disposed on the first dielectric layer, and a third dielectric layer disposed on the second dielectric layer;
    a first conductive layer disposed in the second dielectric layer;
    a second conductive layer disposed in the second dielectric layer and spaced apart from the first conductive layer, wherein the first conductive layer and the second conductive layer are coplanar, wherein the first conductive layer is electrically connected to a first doped region in the substrate through a first contact plug and the second conductive layer is electrically connected to a second doped region in the substrate through a second contact plug; and
    a cross-like-shaped air gap disposed in the dielectric stack between the first conductive layer and the second conductive layer, wherein the air gap has a tapered upper portion in the third dielectric layer, a tapered lower portion in the first dielectric layer, and a widened middle portion laterally extending into the second dielectric layer toward the first conductive layer and the second conductive layer thereby forming a greatest width of the cross-like-shaped air gap between a top surface of the third dielectric layer and a bottom surface of the first dielectric layer, and wherein the widened middle portion is coplanar with the first conductive layer and the second conductive layer.

\* \* \* \* \*